US012178072B2

(12) United States Patent
Chen

(10) Patent No.: US 12,178,072 B2
(45) Date of Patent: Dec. 24, 2024

(54) DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Zhuofan Chen, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 459 days.

(21) Appl. No.: 17/762,038

(22) PCT Filed: Mar. 3, 2022

(86) PCT No.: PCT/CN2022/078933

§ 371 (c)(1),
(2) Date: Mar. 18, 2022

(87) PCT Pub. No.: WO2023/159664

PCT Pub. Date: Aug. 31, 2023

(65) Prior Publication Data

US 2023/0276655 A1 Aug. 31, 2023

(30) Foreign Application Priority Data

Feb. 25, 2022 (CN) ........................ 202210178332.3

(51) Int. Cl.
*H10K 50/85* (2023.01)
*H10K 50/858* (2023.01)
(Continued)

(52) U.S. Cl.
CPC .......... *H10K 50/858* (2023.02); *H10K 59/30* (2023.02); *H10K 2102/311* (2023.02)

(58) Field of Classification Search
CPC ............................ H10K 50/858; H10K 59/30
(Continued)

(56) References Cited

U.S. PATENT DOCUMENTS

2017/0287988 A1 10/2017 Lee et al.
2020/0296843 A1 9/2020 Gao et al.
(Continued)

FOREIGN PATENT DOCUMENTS

CN 110199572 A 9/2019
CN 111063706 A 4/2020
(Continued)

OTHER PUBLICATIONS

PCT International Search Report for International Application No. PCT/CN2022/078933, mailed on Nov. 29, 2022, 10pp.
(Continued)

*Primary Examiner* — Phuc T Dang
(74) *Attorney, Agent, or Firm* — The Roy Gross Law Firm, LLC; Roy Gross

(57) ABSTRACT

A display device is provided. A boundary of a projection of a first opening on a substrate is located between an inscribed circle and a circumscribed circle of a boundary of a projection of a corresponding subpixel on the substrate, so that the first opening cannot completely cover the corresponding subpixel. In this way, a light condensing effect in a non-planar display area is reduced, a bad experience with certain viewing angles in conventional non-planar display areas for users is improved, and user experience is enhanced.

10 Claims, 3 Drawing Sheets

(51) Int. Cl.
*H10K 59/30* (2023.01)
*H10K 102/00* (2023.01)

(58) Field of Classification Search
USPC .......................................................... 257/89
See application file for complete search history.

(56) References Cited

U.S. PATENT DOCUMENTS

| | | | | |
|---|---|---|---|---|
| 2021/0066667 | A1 | 3/2021 | Yun et al. | |
| 2022/0209144 | A1 * | 6/2022 | Shin .................... | H10K 77/111 |

FOREIGN PATENT DOCUMENTS

| | | | | |
|---|---|---|---|---|
| CN | 111628107 | A | 9/2020 | |
| CN | 111668384 | A | 9/2020 | |
| CN | 111834542 | A | 10/2020 | |
| CN | 111834545 | A | 10/2020 | |
| CN | 112038370 | A | 12/2020 | |
| CN | 112542500 | A | 3/2021 | |
| CN | 113167934 | A | 7/2021 | |
| CN | 113299625 | A | 8/2021 | |
| CN | 113299698 | A | 8/2021 | |
| CN | 113328054 | A * | 8/2021 | ......... H01L 27/3246 |
| CN | 113328055 | A | 8/2021 | |
| CN | 113690391 | A | 11/2021 | |
| CN | 113745298 | A * | 12/2021 | ......... H01L 27/1218 |
| IN | 111509020 | A | 8/2020 | |
| JP | 2017215571 | A | 12/2017 | |
| WO | 2021258474 | A1 | 12/2021 | |

OTHER PUBLICATIONS

PCT Written Opinion of the International Search Authority for International Application No. PCT/CN2022/078933, mailed on Nov. 29, 2022, 7pp.

Japanese Office Action issued in corresponding Japanese Patent Application No. 2022-542084 dated Mar. 12, 2024, pp. 1-5, 10pp.

Korean Office Action issued in corresponding Korean Patent Application No. 10-2022-7012612 dated Mar. 18, 2024, pp. 1-7, 14pp.

Chinese Office Action issued in corresponding Chinese Patent Application No. 202210178332.3 dated Mar. 31, 2023, pp. 1-16, 16pp.

* cited by examiner

DISPLAY DEVICE

CROSS REFERENCE TO RELATED APPLICATIONS

This application is a National Phase of PCT Patent Application No. PCT/CN2022/078933 having International filing date of Mar. 3, 2022, which claims the benefit of priority of Chinese Patent Application No. 202210178332.3, filed Feb. 25, 2022, the contents of which are all incorporated herein by reference in their entirety.

BACKGROUND OF INVENTION

1. Field of the Invention

The present application relates to a technical field of displays, and particularly, to a display device.

2. Related Art

Organic light-emitting diodes (OLEDs) are a kind of organic thin-film electroluminescent device. OLEDs have become one of the most important display technologies today due to their advantages of easy fabrication of flexible structures, wide viewing angles, low voltage requirements, high power efficiency, quick response times, being light in weight, being thin, being simplified in structure, low cost, almost infinitely high contrast, low power consumption, extremely high response speed, etc.

In order to reduce power consumption of OLED display devices and improve display luminous efficiency of the OLED display devices, light condensing structures are generally provided on light-emitting sides of light-emitting units of display devices to collect light emitted by the light-emitting units to improve light-emitting intensity. Currently, subpixels have edges and corners, and corresponding light condensing structures also have edges and corners. In addition, the light condensing structures are relatively fragile. The light condensing structures are extremely varied in shape in non-planar display areas, which is prone to stress concentration and causes the light condensing structures to fall off and formation of cracks.

SUMMARY OF INVENTION

An object of the present invention is to provide a display device, capable of solving problems with conventional display devices that light condensing structures are extremely varied in shape and have edges and corners, which is prone to stress concentration and causes the light condensing structures to fall off and formation of cracks.

In order to solve the above problems, the present invention provides a display device, having a planar display area and a non-planar display area, and including: a substrate; a light-emitting layer disposed on the substrate and including a plurality of spaced apart subpixels disposed on the substrate; a first optical film layer disposed on a side of the light-emitting layer away from the substrate, wherein at least a first opening is located corresponding to a position of one of the subpixels in the first optical film layer in the non-planar display area; a second optical film layer covering a surface of the first optical film layer away from the substrate and filled in the first opening. The first optical film layer has a refractive index less than a refractive index of the second optical film layer. A boundary of a projection of the first opening on the substrate is located between an inscribed circle and a circumscribed circle of a boundary of a projection of the corresponding subpixel on the substrate.

Further, the boundary of the projection of the first opening on the substrate and the boundary of the projection of the corresponding subpixel on the substrate define a plurality of intersection points, and the boundary of the projection of the first opening on the substrate is an arc between adjacent two of the intersection points.

Further, a virtual center point is defined within the boundary of the projection of the first opening on the substrate, and each of the intersection points on the boundary of the projection of the first opening on the substrate is spaced from the virtual center point at a same distance.

Further, a projection shape of the first opening on the substrate comprises a circle.

Further, the first opening and the corresponding subpixel are centrosymmetrical in shape, a center of the projection of the first opening and a center of the projection of the corresponding subpixel on the substrate coincide with each other, and the center of the first opening is spaced from each of the intersection points at a same distance.

Further, a projection shape of the first opening on the substrate includes a circle.

Further, a major axis of the ellipse is parallel to a dividing line between the planar display area and the non-planar display area.

Further, the subpixels include a first subpixel, a second subpixel, and a third subpixel having colors different from each other.

Further, in a direction from an end close to the planar display area to an end away from the planar display area, a projection area of at least one of the first subpixel, the second subpixel, or the third subpixel on the substrate in the non-planar display area gradually decreases.

Further, the subpixels include a first subpixel, a second subpixel, and a third subpixel having colors different from each other, and a projection of at least one of the first subpixel, the second subpixel, or the third subpixel on the substrate in the non-planar display coincides with a projection of a corresponding first opening on the substrate.

Further, at least a second opening is located corresponding to a position of one of the subpixels in the first optical film layer in the planar display area, the second optical film layer is further filled in the second opening, and projections of the subpixels on the substrate in the planar display area coincide with projections of corresponding second openings on the substrate, respectively.

The present invention has advantageous effects as follows: in the display device of the present invention, the boundary of the projection of the first opening on the substrate is located between the inscribed circle and the circumscribed circle of the boundary of the projection of the corresponding subpixel on the substrate, so that the first opening cannot completely cover the corresponding subpixel, thereby reducing the light condensing effect in the non-planar display area, improving the bad experience with certain viewing angles in conventional non-planar display areas for users, and enhancing user experience. In the display device of the present invention, there are the plurality of intersection points between the boundary of the projection of the first opening on the substrate and the boundary of the projection of the corresponding one of the subpixels on the substrate, and the boundary of the projection of the first opening on the substrate is the arc between adjacent two of the intersection points. In this way, stress on the non-planar display area is relieved, and a stress concentration effect in the non-planar display area is reduced, thereby preventing the first optical film layer and the second optical film layer from falling off and preventing cracks from occurring in the first optical film layer and the second optical film layer.

BRIEF DESCRIPTION OF DRAWINGS

In order to better illustrate the technical solutions in the embodiments of the present application, the following will briefly introduce the accompanying drawings that need to be used in the description of the embodiments. Apparently, the accompanying drawings in the following description show merely some embodiments of the present invention, and a person skilled in the art may still derive other drawings from these accompanying drawings without creative efforts.

DESCRIPTION OF PREFERRED EMBODIMENTS

Figure 1:
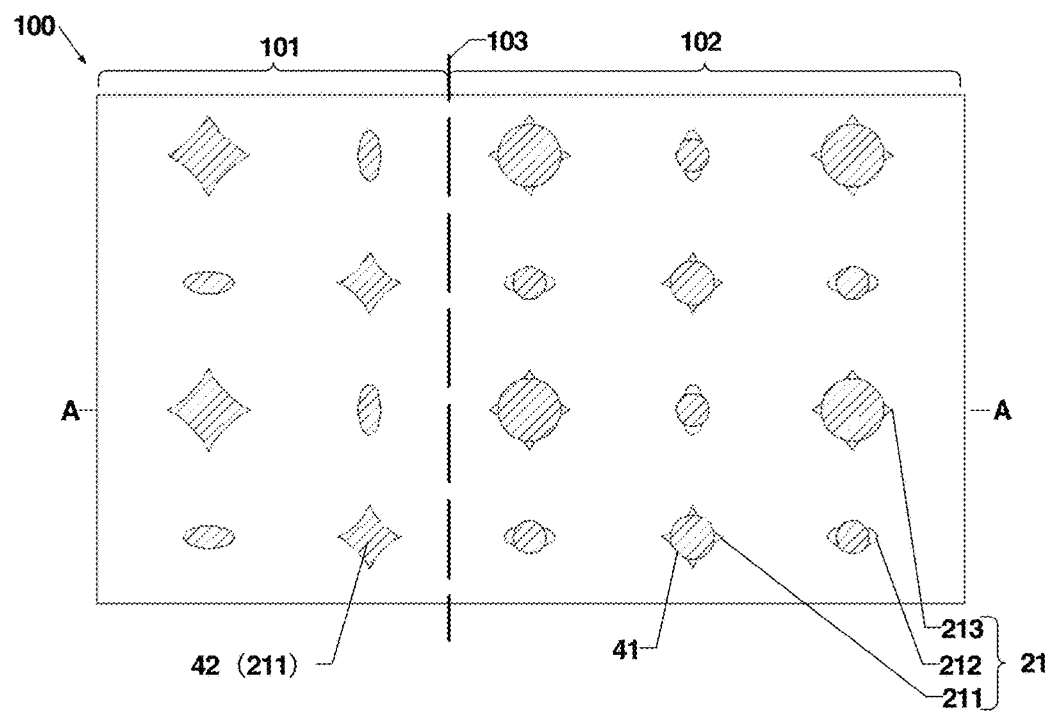
FIG. 1 is a schematic plan view of a display device before being bent according to a first embodiment of the present invention.

The preferred embodiments of the present invention are described in detail below with reference to the accompanying drawings, so as to fully introduce the technical content of the present invention to those skilled in the art, and examples are given to prove that the present invention can be implemented, so as to make the technical content disclosed in the present invention clearer, and to make it easier for those skilled in the art to understand how to implement the present invention. However, the present invention can be embodied in many different forms of embodiments, the protection scope of the present invention is not limited to the embodiments mentioned herein, and the description of the following embodiments is not intended to limit the scope of the present invention.

Directional terms described by the present invention, such as upper, lower, front, back, left, right, inner, outer, side, etc., are only directions by referring to the accompanying drawings, and the directional terms used herein are used to explain and illustrate the present invention, rather than to limit the protection scope of the present invention.

In the drawings, structurally identical components are denoted by the same numerals, and structurally or functionally similar components are denoted by like numerals throughout. In addition, for ease of understanding and description, the size and thickness of each component shown in the accompanying drawings are arbitrarily shown, and the present invention does not limit the size and thickness of each component.

Embodiment 1

Figure 2:
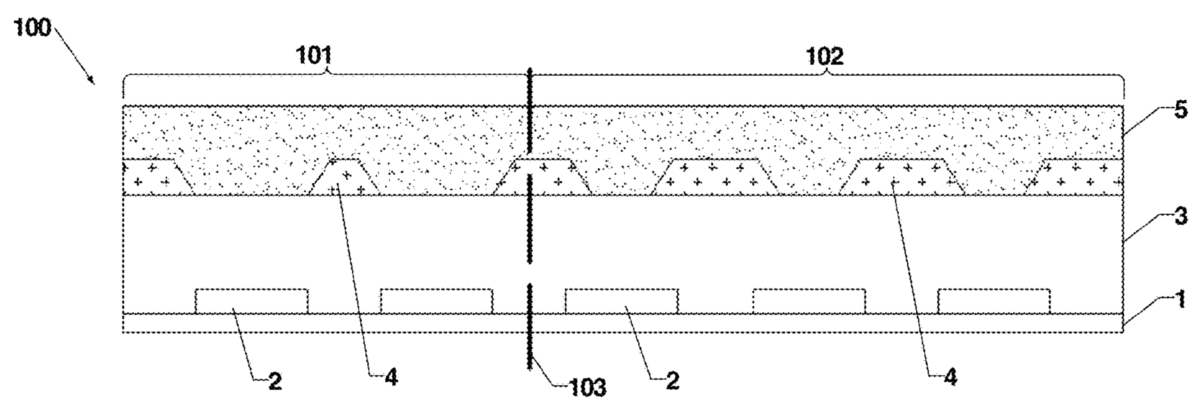
FIG. 2 is a cross-sectional view taken along line A-A in FIG. 1.

As shown in FIGS. 1 and 2, this embodiment provides a display device 100. The display device 100 includes a planar display area 101, a non-planar display area 102, and a dividing line 103 between the planar display area 101 and the non-planar display area 102.

In this embodiment, the display device 100 is a curved display device, and the non-planar display area 102 is a curved display area. In other embodiments, the display device 100 may also be a foldable display device, and the non-curved display area 102 is a bent display area.

As shown in FIG. 2, the display device 100 includes a substrate 1, a light-emitting layer 2, an encapsulation layer 3, a first optical film layer 4, and a second optical film layer 5.

Specifically, the substrate 1 is arranged in the planer display area 101 and the non-planar display area 102. The substrate 1 is made of a material including one or more of glass, polyimide, polycarbonate, polyethylene terephthalate, or polyethylene naphthalate, so that the substrate 1 can have better impact resistance to effectively protect the display device 100.

Specifically, the light-emitting layer 2 is disposed on the substrate 1. The light-emitting layer 2 includes a plurality of subpixels 21 arranged at intervals on the substrate 1. In this embodiment, each of the subpixels 21 is centrosymmetrical in shape.

Specifically, the subpixels 21 include a first subpixel 211, a second subpixel 212, and a third subpixel 213 having colors different from each other. In this embodiment, the first subpixel 211 is a red subpixel, the second subpixel 212 is a green subpixel, and the third subpixel 213 is a blue subpixel.

The encapsulation layer 3 is disposed on a side of the light-emitting layer 2 away from the substrate 1. The encapsulation layer 3 is mainly configured to prevent moisture and oxygen from invading the light-emitting layer 2, thereby increasing a service life of the display device 100. Specifically, the encapsulation layer 3 may include a film layer structure such as a first inorganic layer, an organic layer, and a second inorganic layer.

As shown in FIG. 2, the first optical film layer 4 is disposed on a side of the encapsulation layer 3 away from the substrate. The first optical film layer 4 has a refractive index ranging from 1.3 to 1.6. In this embodiment, the refractive index of the first optical film layer 4 is 1.4. The first optical film layer 4 may be made of an organic material, such as acrylic or epoxy resin, or an inorganic material, such as silicon dioxide ($SiO2$) or silicon oxynitride (SiON).

As shown in FIG. 2, the second optical film layer 5 covers a surface of the first optical film layer 4 on a side away from the substrate 1. The second optical film layer 5 has a refractive index ranging from 1.5 to 1.9. The refractive index of the first optical film layer 4 is less than the refractive index of the second optical film layer 5. In this embodiment, the refractive index of the second optical film layer 5 is 1.7.The second optical film layer 5 may be made of an organic material doped with nanoparticles, such as zirconium dioxide ($ZrO2$), titanium dioxide ($TiO2$), etc., or an organic and inorganic hybrid material such as metalloxanes.

As shown in FIGS. 1 and 2, at least a first opening 41 is located corresponding to a position of one of the subpixels 21 in the first optical film layer 4 in the non-planar display area 102.

Specifically, a boundary of a projection of the first opening 41 on the substrate 1 and a boundary of a projection of a corresponding one of the subpixels 21 on the substrate 1 define a plurality of intersection points, and the boundary of the projection of the first opening 41 on the substrate 1 is an arc between adjacent two of the intersection points. Specifically, a virtual center point is defined within the boundary of the projection of the first opening 41 on the substrate 1, and each of the intersection points on the boundary of the projection of the first opening 41 on the substrate is spaced from the virtual center point at a same distance. In this way, stress on the non-planar display area 102 is relieved, and a stress concentration effect in the non-planar display area 102 is reduced, thereby preventing the first optical film layer 4 and the second optical film layer 5 from falling off and preventing cracks from occurring in the first optical film layer 4 and the second optical film layer 5.

Specifically, the second optical film layer 5 is further filled in the first opening 41. In this embodiment, each of the first openings 41 is centrosymmetrical in shape, and a center of the projection of each of the first openings 41 and a center of the projection of the corresponding subpixel 21 on the substrate 1 coincide with each other. Therefore, the first openings 41 can well condense light from the subpixels 21, thereby improving luminous intensity of the display device 100.

Specifically, the boundary of the projection of the first opening 41 on the substrate 1 is located between an inscribed circle and a circumscribed circle of the boundary of the projection of the corresponding subpixel 21 on the substrate 1. As a result, the first opening 41 cannot completely cover the corresponding subpixel 21, thereby reducing a light condensing effect in the non-planar display area 102, Specifically, a projection shape of the first opening 41 on the substrate 1 includes a circle. In this embodiment, the projection shape of the first opening 41 on the substrate 1 is a circle. A center of the first opening 41 is spaced at a same distance from each of the intersection points. Therefore, while ensuring that the first opening 41 has a desired extent of the light condensing effect, it also provides an effect of alleviating the stress concentration effect.

As shown in FIGS. 1 and 2, at least a second opening 41 is located corresponding to a position of one of the subpixels 21 in the first optical film layer 4 in the planar display area 101. Specifically, the second optical film layer 5 is further filled in the second opening 42. In this embodiment, projections of the subpixels 21 on the substrate 1 in the planar display area 101 coincide with projections of corresponding second openings 42 on the substrate 1, respectively.

Embodiment 2

Figure 3:
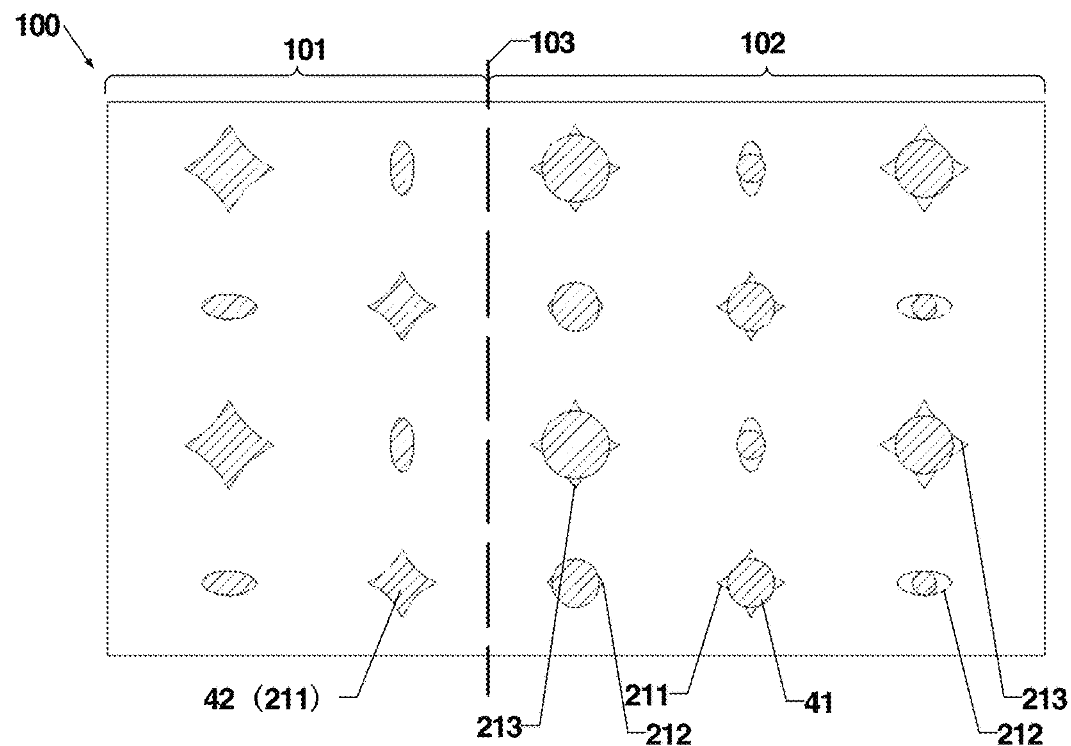
FIG. 3 is a schematic plan view of a display device before being bent according to a second embodiment of the present invention.

As shown in FIG. 3, this embodiment includes most of the technical features in the first embodiment. Differences between this embodiment and the first embodiment are that in this embodiment, in a direction from an end close to the planar display area 101 to an end away from the planar display area 101, a projection area of at least one of the first subpixel 211, the second subpixel 212, or the third subpixel 213 on the substrate 1 in the non-planar display area 102 gradually decreases.

In this embodiment, the further the non-planar display area 102 of the display panel away from the planar display area 101 is, the greater a degree of curvature of the display panel is, and the greater users' viewing angle shifts are. By making the projection area of at least one of the first subpixel 211, the second subpixel 212, or the third subpixel 213 on the substrate 1 in the non-planar display area 102 gradually decrease, the light condensing effect of the first opening 41 is gradually reduced, and a bad experience with certain viewing angles in conventional non-planar display areas for users is improved, thus enhancing user experience.

In the display device 100 of this embodiment, the boundary of the projection of the first opening 41 on the substrate 1 is located between the inscribed circle and the circumscribed circle of the boundary of the projection of the corresponding subpixel 21 on the substrate 1, so that the first opening 41 cannot completely cover the corresponding subpixel 21, thereby reducing the light condensing effect in the non-planar display area 102, improving the bad experience with certain viewing angles in conventional non-planar display areas for users, and enhancing user experience. In the display device 100 of this embodiment, there are a plurality of intersection points between the boundary of the projection of the first opening 41 on the substrate 1 and the boundary of the projection of the corresponding one of the subpixels 21 on the substrate 1, and the boundary of the projection of the first opening 41 on the substrate 1 is the arc between adjacent two of the intersection points. In this way, stress on the non-planar display area 102 is relieved, and a stress concentration effect in the non-planar display area 102 is reduced, thereby preventing the first optical film layer 4 and the second optical film layer 5 from falling off and preventing cracks from occurring in the first optical film layer 4 and the second optical film layer 5.

Embodiment 3

Figure 4:
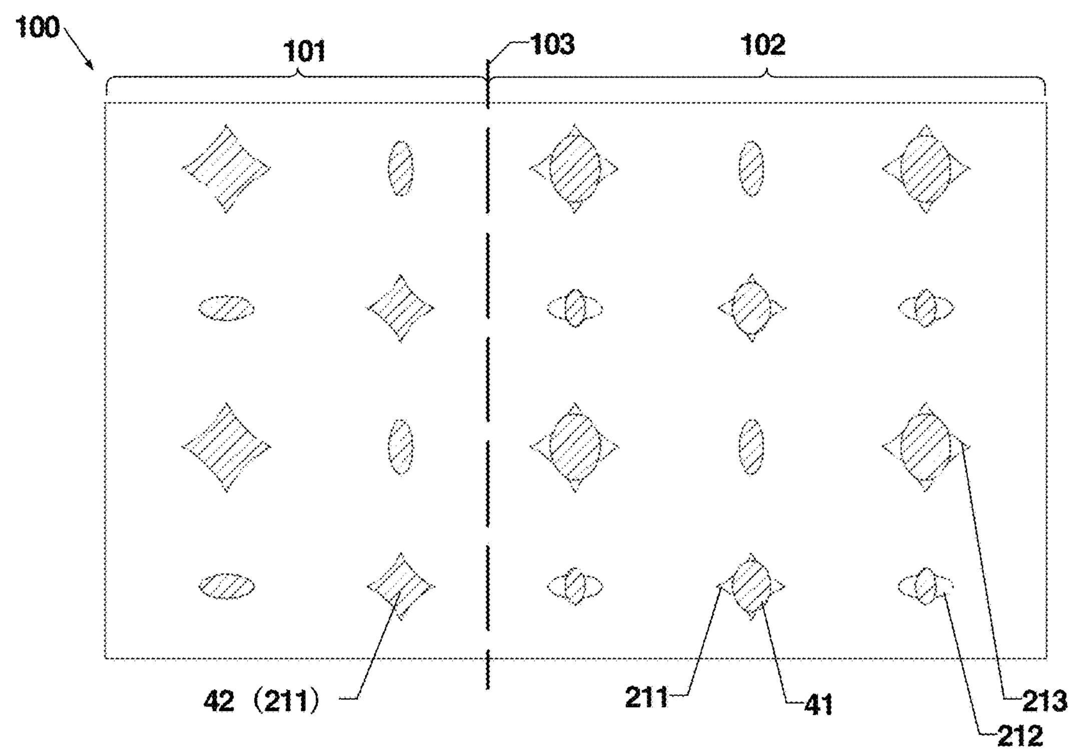
FIG. 4 is a schematic plan view of a display device before being bent according to a third embodiment of the present invention.

As shown in FIG. 4, this embodiment includes most of the technical features in the first embodiment, differences between this embodiment and the first Embodiment are that: the projection shape of the first opening 41 on the substrate 1 further includes an ellipse. A major axis of the ellipse is parallel to the dividing line 103 between the planar display area 101 and the non-planar display area 102.

In this embodiment, the major axis of the ellipse is parallel to the dividing line 103. When the display device 100 is bent along the dividing line 103, the stress on the non-planar display area 102 is relatively small, and a stress concentration effect in the non-planar display area 102 is reduced, thereby preventing the first optical film layer 4 and the second optical film layer 5 from falling off and preventing cracks from occurring in the first optical film layer 4 and the second optical film layer 5.

In the display device 100 of this embodiment, the boundary of the projection of the first opening 41 on the substrate 1 is located between the inscribed circle and the circumscribed circle of the boundary of the projection of the corresponding subpixel 21 on the substrate 1, so that the first opening 41 cannot completely cover the corresponding subpixel 21, thereby reducing the light condensing effect in the non-planar display area 102, improving the bad experience with certain viewing angles in conventional non-planar display areas for users, and enhancing user experience. In the display device 100 of this embodiment, there are a plurality of intersection points between the boundary of the projection of the first opening 41 on the substrate 1 and the boundary of the projection of the corresponding one of the subpixels 21 on the substrate 1, and the boundary of the projection of the first opening 41 on the substrate 1 is the arc between adjacent two of the intersection points. In this way, stress on the non-planar display area 102 is relieved, and a stress concentration effect in the non-planar display area 102 is reduced, thereby preventing the first optical film layer 4 and the second optical film layer 5 from falling off and preventing cracks from occurring in the first optical film layer 4 and the second optical film layer 5.

Embodiment 4

Figure 5:
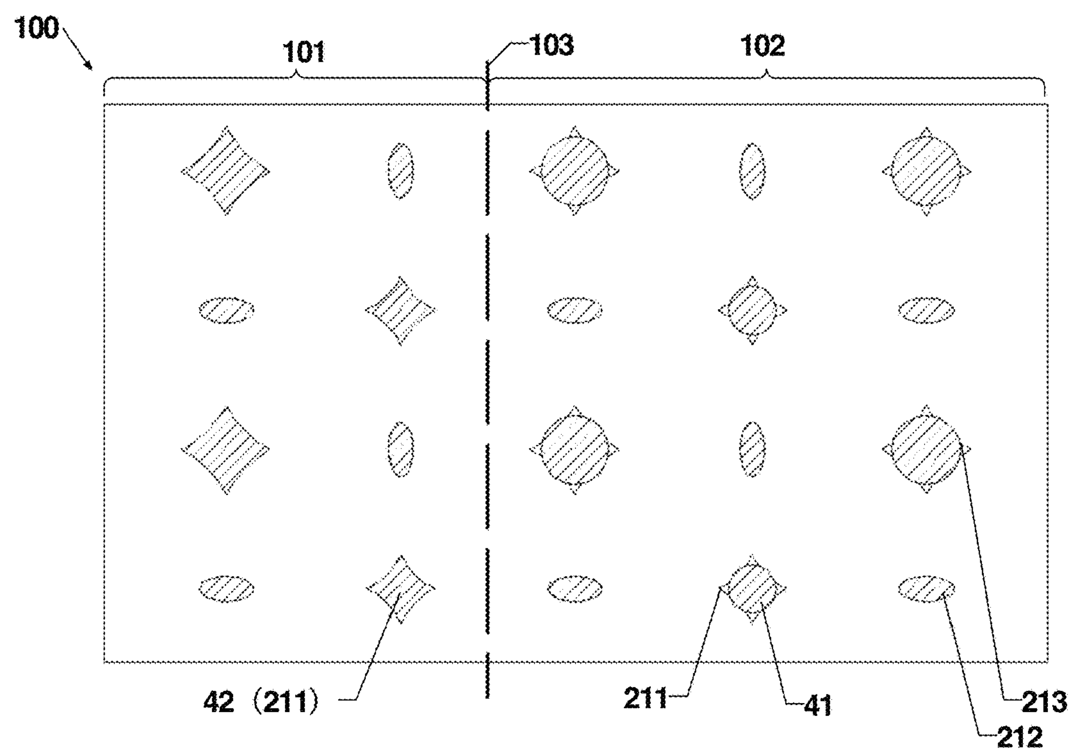
FIG. 5 is a schematic plan view of a display device before being bent according to a fourth embodiment of the present invention.

As shown in FIG. 5, this embodiment includes most of the technical features in the first embodiment. Differences between this embodiment and the first embodiment are that in this embodiment, a projection of at least one of the first subpixel 211, the second subpixel 212, or the third subpixel 213 on the substrate 1 in the non-planar display area 102 coincides with a projection of a corresponding one of the first opening 41 on the substrate 1.

In this embodiment, the second subpixel 212 located in the non-planar display area 102 is oval in shape, and a major axis and a minor axis of the second subpixel 212 are not equal. A projection of the first opening 41 on the substrate 1 in the non-planar display area 102 coincides with the corresponding second subpixel 212 on the substrate 1, respectively. The first openings 41 corresponding to the first subpixel 211 and the third subpixel 213 in the non-planar display area 102 are round in shape, respectively.

In the display device 100 of this embodiment, the boundary of the projection of the first opening 41 on the substrate 1 is located between the inscribed circle and the circumscribed circle of the boundary of the projection of the corresponding subpixel 21 on the substrate 1, so that the first opening 41 cannot completely cover the corresponding subpixel 21, thereby reducing the light condensing effect in the non-planar display area 102, improving the bad experience with certain viewing angles in conventional non-planar display areas for users, and enhancing user experience. In the display device 100 of this embodiment, there are a plurality of intersection points between the boundary of the projection of the first opening 41 on the substrate 1 and the boundary of the projection of the corresponding one of the subpixels 21 on the substrate 1, and the boundary of the projection of the first opening 41 on the substrate 1 is the arc between adjacent two of the intersection points. In this way, stress on the non-planar display area 102 is relieved, and a stress concentration effect in the non-planar display area 102 is reduced, thereby preventing the first optical film layer 4 and the second optical film layer 5 from falling off and preventing cracks from occurring in the first optical film layer 4 and the second optical film layer 5.

Embodiment 5

Figure 6:
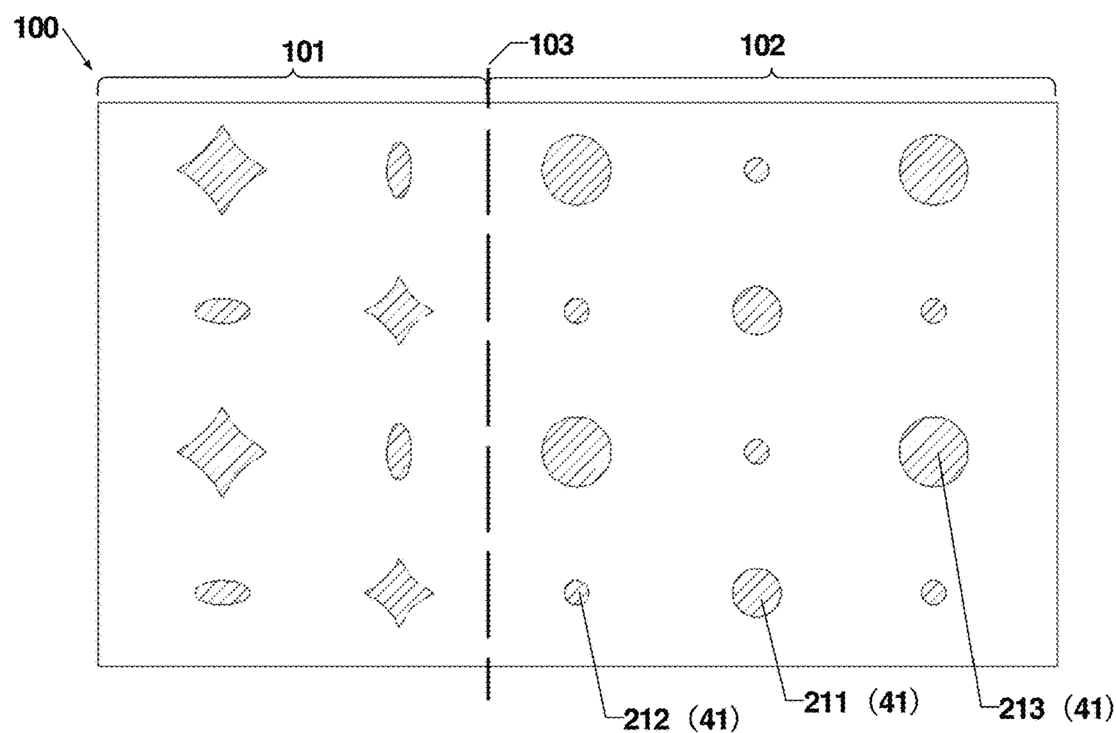
FIG. 6 is a schematic plan view of a display device before being bent according to a fifth embodiment of the present invention.

As shown in FIG. 6, this embodiment includes most of the technical features in the first embodiment. Differences between this embodiment and the first embodiment are that in this embodiment, projections of the first subpixel 211, the second subpixel 212, and the third subpixel 213 on the substrate 1 in the non-planar display area 102 coincide with projections of corresponding first openings 41 on the substrate 1, respectively.

In this embodiment, each of the first subpixel 211, the second subpixel 212, and the third subpixel 213 located in the non-planar display area 102 is round in shape, and the first openings 41 corresponding to the first subpixel 211, the second subpixel 212, and the third subpixel 213 in the non-planar display area 102 are all round in shape.

In the display device 100 of this embodiment, in the display device 100, the boundary of the projection of the first opening 41 on the substrate 1 is located between the inscribed circle and the circumscribed circle of the boundary of the projection of the corresponding subpixel 21 on the substrate 1, so that the first opening 41 cannot completely cover the corresponding subpixel 21, thereby reducing the light condensing effect in the non-planar display area 102, improving the bad experience with certain viewing angles in conventional non-planar display areas for users, and enhancing user experience. In the display device 100 of this embodiment, there are a plurality of intersection points between the boundary of the projection of the first opening 41 on the substrate 1 and the boundary of the projection of the corresponding one of the subpixels 21 on the substrate 1, and the boundary of the projection of the first opening 41 on the substrate 1 is the arc between adjacent two of the intersection points. In this way, stress on the non-planar display area 102 is relieved, and a stress concentration effect in the non-planar display area 102 is reduced, thereby preventing the first optical film layer 4 and the second optical film layer 5 from falling off and preventing cracks from occurring in the first optical film layer 4 and the second optical film layer 5.

The display device provided by the present application has been described in detail above. Specific embodiments are used herein to illustrate the principles and implementation of the application, and the descriptions of the above embodiments are only intended to help understand the methods and core ideas of the application; In addition, for those skilled in the art, according to the idea of the application, there will be changes in the specific implementation and the scope of application. In summary, the content of this specification should not be construed as a limitation of the application.

What is claimed is:

1. A display device, having a planar display area and a non-planar display area, and comprising:
- a substrate;
- a light-emitting layer disposed on the substrate and comprising a plurality of spaced apart subpixels disposed on the substrate;
- a first optical film layer disposed on a side of the light-emitting layer away from the substrate, wherein at least a first opening is located corresponding to a position of one of the subpixels in the first optical film layer in the non-planar display area; and
- a second optical film layer covering a surface of the first optical film layer away from the substrate and filled in the first opening, wherein the first optical film layer has a refractive index less than a refractive index of the second optical film layer; and
- wherein a boundary of a projection of the first opening on the substrate is located between an inscribed circle and a circumscribed circle of a boundary of a projection of the corresponding subpixel on the substrate.

2. The display device of claim 1, wherein the boundary of the projection of the first opening on the substrate and the boundary of the projection of the corresponding subpixel on the substrate define a plurality of intersection points, and the boundary of the projection of the first opening on the substrate is an arc between adjacent two of the intersection points.

3. The display device of claim 2, wherein a virtual center point is defined within the boundary of the projection of the first opening on the substrate, and each of the intersection points on the boundary of the projection of the first opening on the substrate is spaced from the virtual center point at a same distance.

4. The display device of claim 2, wherein a projection shape of the first opening on the substrate comprises a circle.

5. The display device of claim 4, wherein the first opening and the corresponding subpixel are centrosymmetrical in shape, a center of the projection of the first opening and a center of the projection of the corresponding subpixel on the substrate coincide with each other, and the center of the first opening is spaced from each of the intersection points at a same distance.

6. The display device of claim 2, wherein a projection shape of the first opening on the substrate comprises an ellipse.

7. The display device of claim 6, wherein a major axis of the ellipse is parallel to a dividing line between the planar display area and the non-planar display area.

8. The display device of claim 2, wherein the subpixels comprise a first subpixel, a second subpixel, and a third subpixel having colors different from each other;

wherein, in a direction from an end close to the planar display area to an end away from the planar display area, a projection area of at least one of the first subpixel, the second subpixel, or the third subpixel on the substrate in the non-planar display area gradually decreases.

9. The display device of claim 2, wherein the subpixels comprise a first subpixel, a second subpixel, and a third subpixel having colors different from each other, and a projection of at least one of the first subpixel, the second subpixel, or the third subpixel on the substrate in the non-planar display coincides with a projection of a corresponding first opening on the substrate.

10. The display device of claim 1, wherein at least a second opening is located corresponding to a position of one of the subpixels in the first optical film layer in the planar display area, the second optical film layer is further filled in the second opening, and projections of the subpixels on the substrate in the planar display area coincide with projections of corresponding second openings on the substrate, respectively.

* * * * *